US009607823B2

(12) United States Patent
Posseme

(10) Patent No.: US 9,607,823 B2
(45) Date of Patent: Mar. 28, 2017

(54) PROTECTION METHOD FOR PROTECTING A SILICIDE LAYER

(71) Applicant: COMMISSARIAT À L'ENERGIE ATOMIQUE ET AUX ENERGIES ALTERNATIVES, Paris (FR)

(72) Inventor: Nicolas Posseme, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/029,148

(22) PCT Filed: Nov. 19, 2014

(86) PCT No.: PCT/FR2014/052964
§ 371 (c)(1),
(2) Date: Apr. 13, 2016

(87) PCT Pub. No.: WO2015/075379
PCT Pub. Date: May 28, 2015

(65) Prior Publication Data
US 2016/0240371 A1 Aug. 18, 2016

(30) Foreign Application Priority Data
Nov. 20, 2013 (FR) .................................. 13 61393

(51) Int. Cl.
H01L 29/00 (2006.01)
H01L 21/02 (2006.01)
H01L 21/285 (2006.01)
H01L 21/768 (2006.01)
H01L 21/311 (2006.01)

(52) U.S. Cl.
CPC .. *H01L 21/02115* (2013.01); *H01L 21/02274* (2013.01); *H01L 21/28518* (2013.01); *H01L 21/31116* (2013.01); *H01L 21/76814* (2013.01); *H01L 21/76877* (2013.01); *H01L 2221/1063* (2013.01)

(58) Field of Classification Search
CPC ......... H01L 21/02115; H01L 21/28518; H01L 21/02274
USPC .......................................................... 438/29
See application file for complete search history.

(56) References Cited

U.S. PATENT DOCUMENTS

2004/0256645 A1 12/2004 Tsuchiaki et al.
2008/0311718 A1 12/2008 Futase
(Continued)

FOREIGN PATENT DOCUMENTS

JP 2011-233713 A 11/2011

OTHER PUBLICATIONS

Mar. 17, 2015 Search Report issued in International Patent Application No. PCT/FR2014/052964.

*Primary Examiner* — David S Blum
(74) *Attorney, Agent, or Firm* — Oliff PLC

(57) ABSTRACT

The method includes the steps of: a) providing a stack including, successively, a substrate, a silicide layer formed on the substrate, and a silicon nitride layer covering at least the silicide layer, b) etching predefined regions of the silicon nitride layer in such a way as to expose at least areas of the silicide layer intended to form the electrical contacts, and c) depositing a protective layer on at least the areas of the silicide layer exposed in step b), the method not including a step of exposing the stack to moisture between step b) and step c), in particular moisture from the ambient air.

16 Claims, 3 Drawing Sheets

(56) References Cited

U.S. PATENT DOCUMENTS

2010/0107927 A1 5/2010 Stewart et al.
2010/0221912 A1 9/2010 Nakayama et al.
2010/0330794 A1 12/2010 Kurisu et al.
2013/0109187 A1 5/2013 Nemani et al.

PROTECTION METHOD FOR PROTECTING A SILICIDE LAYER

The present invention concerns a protection method for protecting a silicide layer intended to form electrical contacts for integrated circuits.

The manufacture of electrical contacts for integrated circuits on silicon substrate implies the formation of a silicide material on the substrate in order to reduce the electrical contact resistance between the semiconductor material and the metal of the electrical contact. This silicide material is generally formed from a silicide layer whose areas that will be used for the contacts are exposed by means of a localized etching. However, once brought in contact with air, these areas deteriorate and form a residue at their surface by reaction with air humidity and the remainder of the etching reactant. This residue limits the quality of the electrical contacts formed subsequently, thereby resulting in a loss of efficiency. An increase in the defectiveness of the contacts is also observed, which is more critical as the size of the contacts decreases with the technology nodes.

Wet etching of the substrate and of the silicide areas in order to clean the surface remains ineffective for avoiding the formation of these residues. Another solution consists in applying plasma of oxygen. But such a step could damage the silicide by oxidation or by modification of the chemical composition of the silicide. Another possibility consists of a $N_2/H_2$-based cleaning, implemented in situ in the etching reactor. Nonetheless, once the silicide areas are brought into contact with air, the apparition of the residues is delayed but the latter are always formed over time.

One of the aims of the invention consists in resolving this problem. To this end, the present invention provides a protection method for protecting a silicide layer intended to form electrical contacts for integrated circuits, the protection method comprising the steps consisting in:

a) Providing a stack comprising successively:
a substrate,
a silicide layer formed on the substrate, and
a silicon nitride layer covering at least the silicide layer,
b) Etching determined regions of the silicon nitride layer so as to expose at least areas of the silicide layer intended to form the electrical contacts, and
c) Depositing a protective layer at least over the areas of the silicide layer exposed at step b),
the protection method being devoid of any step of exposition of the stack to humidity between step b) and step c), in particular to ambient air humidity.

Thanks to this protection method, the remainders of the reactants used for etching the silicon nitride layer are retrieved when depositing the protective layer. Since this protective layer has been formed without any intermediate contact between the exposed areas of the silicide layer and humidity between step b) and c), the corrosion of the silicide layer generating residues in the presence of the etching remainders and humidity, is prevented. Indeed, this protection method allows avoiding any contact between the silicide metal, the remainders of the etching reactants and air humidity. Thus, the parasitic reaction generating residues difficult to retrieve by wet etching, is prevented. It is then possible to expose the stack and the silicide areas to ambient air without risking the formation of said residues. Thus, the rest of the components manufacturing method may be performed in a conventional manner.

According to one arrangement, the etching step b) is a fluorinated plasma etching, such as a $CH_3F$-based plasma. Indeed, this fluorinated plasma is very effective in selectively etching the determined regions of the silicon nitride layer. Nonetheless, such etching leaves fluorine traces at the surface of the stack, which would clearly promote the formation of said residues on the silicide areas when the stack is placed in the open air or in an atmosphere containing water in the absence of the protective layer.

Preferably, steps b) and c) are implemented in the same chamber of a reactor, preferably a capacitively-coupled or an inductively-coupled reactor. Thus, it is possible to completely avoid the formation of residues by avoiding any contact with air humidity prior to forming the protective layer.

According to one arrangement, the protection method comprises, after step c), a step d) consisting in subjecting the stack to a wet cleaning, in particular through a $NH_4OH/H_2O_2$ solution. Such cleaning, performed under SC1-type wet cleaning conditions (SC1 standing for Standard Clean 1) allows retrieving the contaminants and other residues which might alter the quality of the metallization of the silicide areas.

According to another arrangement, the protection method comprises, after step d), a step e) consisting in depositing a layer of a metal, such as tungsten or copper, over the exposed silicide areas at step b) so as to form the electrical contacts. Thus, performant electrical contacts are formed on the silicides, while avoiding the formation of residues which might reduce the surface of the contacts areas.

Preferably, step e) further comprises the deposition of a Ta/TaN or Ti/TiN metallic barrier layer prior to the deposition of the metal layer.

Preferably, the protective layer deposition step c) is carried out by plasma treatment.

According to one arrangement, step c) is carried out by CxOy-based plasma, such as CO-based or CO2-based plasma, so as to form a carbon-containing protective layer.

According to one possibility, the CxOy-based plasma is further formed from one or several gas(es), selected among nitrogen and oxygen, provided at a flow rate comprised between 1 and 150 cm$^3$/min. Thus, even with a deposition duration lasting a few seconds, it is possible to control the speed and/or the thickness of the deposited protective layer.

According to one variant, step c) is carried out by CxHy-based plasma, such as CH4-based plasma, so as to form a carbon-containing protective layer.

Preferably, whether the plasma is a CxOy-based or CxHy-based plasma, step c) is carried out so that the protective layer comprises a carbon content higher than 30% and preferably higher than or equal to 35%. Indeed, this carbon content ensures an optimum protection against the formation of silicide residues, in particular when the silicon nitride etching step is carried out using fluorinated plasma.

According to another variant, step c) is carried out using plasma of a gas comprising silicon, such as SixCly or SixFy, and preferably $SiCl_4$ or $SiF_4$, so as to deposit a silicon-containing protective layer.

Advantageously, the protective layer deposition step c) is carried out using a plasma based on at least one gas selected among CxHy, CxOy, SixCly and SixFy.

Typically, when using a silicon-based or a CxHy-based plasma, step c) is implemented with a plasma further formed from one or several gas(es), selected among nitrogen and oxygen, provided at a flow rate comprised between 50 and 500 cm$^3$/min. Thus, even with a deposition duration lasting a few seconds, it is easy to control the speed and/or the thickness of the deposited protective layer. Thus, it is possible to retrieve this relatively thin protective layer at the opportune moment.

Typically, the nature of the silicide layer is selected among the following natures of silicides: PtSi, NiPtSi, NiSi, $NiSi_2$, $TiSi_2$ (C54 phase), $TiSi_2$ (C49 phase), $Co_2Si$, CoSi, $CoSi_2$, $WSi_2$, $MoSi_2$, $TaSi_2$. Indeed, these silicides present reduced electrical resistances in comparison with a semiconductor substrate, such as a silicon substrate. Thus, a wide choice of silicides natures is available. This choice may be performed according to the desired mechanical resistance of the contact, to the resistance to temperature, or to the capability to receive the metal completing the electrical contact.

Specifically, step b) comprises a step b1) consisting in determining the regions of the silicon nitride layer to be etched, by a protection of portions of the silicon nitride layer to be preserved from the etching with a silicon oxide layer and a step b2) consisting in etching the determined regions.

In a particular configuration, step b1) consisting in protecting portions of the silicon nitride layer to be preserved from etching, is carried out by application of an etching mask over the silicon oxide layer, the mask comprising through openings in line with the determined regions of the silicon nitride layer to be etched.

According to one possibility, step c) is implemented using plasma with a gaseous flow rate of CxHy, SixCly or SixFy comprised between 10 and 100 $cm^3$/min or a gaseous flow rate of CxOy comprised between 50 and 500 $cm^3$/min. The use of a plasma comprising Cl or F does not result in the formation of residues in air as is the case with the use of a fluorinated etching plasma according to step b) of the protection method. The deposited protective layer mainly comprises silicon and the fluorine or the chlorine of the used plasma is very volatile after placing the stack in the open air.

Moreover, step c) is carried out at a pressure comprised between 10 and 200 mTorr.

In the case of a CxHy-based or CxOy-based plasma, the power of the source of the reactor is comprised between 100 and 1000 W. In the case of a SixCly-based or SixFy-based plasma, the power of the source is comprised between 100 and 500 W.

The polarizing power (or bias power) is comprised between 0 and 200 W.

The duration of step c) is comprised between 5 and 60 seconds during which the stack is set to a temperature comprised between 20 and 100° C.

Other aspects, objects and advantages of the present invention will appear better upon reading the following description of an embodiment thereof, given as a non-limiting example and with reference to the appended drawings. For better readability, the figures are not necessarily to the scale of all represented elements. For simplicity, in the following description, identical, similar or equivalent elements of the different embodiments carry the same reference numerals.

Figure 1:
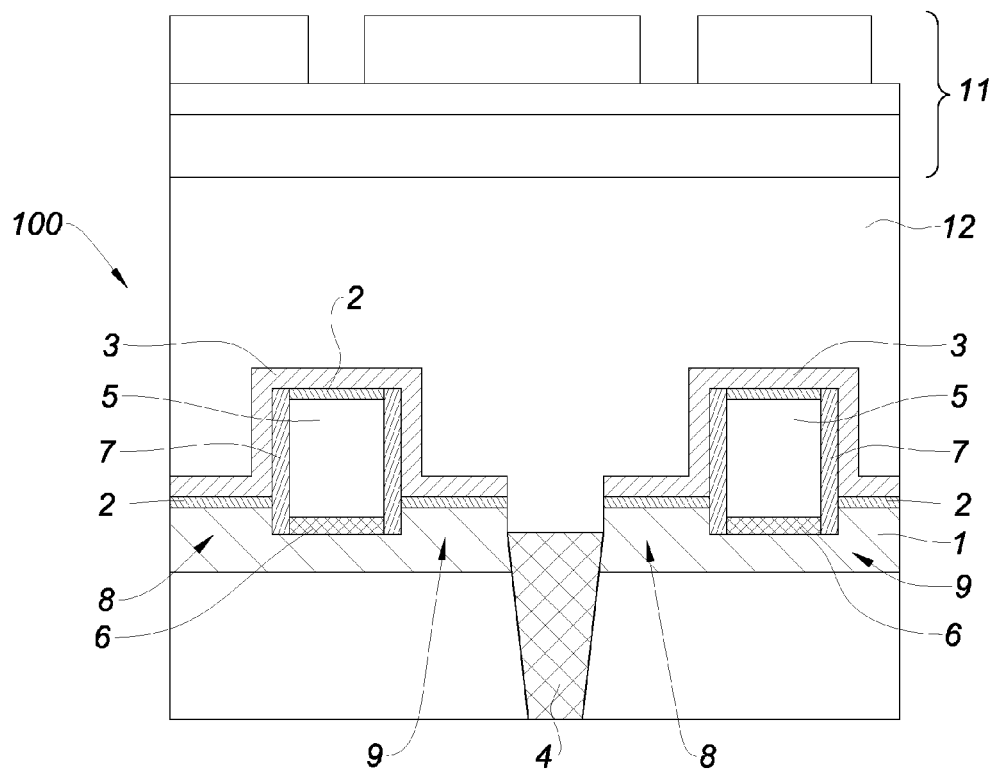
FIG. 1 illustrates a schematic sectional view of a stack comprising a mask for determining the regions of the silicon nitride layer to be etched according to an embodiment of the invention.

FIG. 1 illustrates a stack 100 successively comprising a substrate 1, in particular made of silicon, a silicide layer 2 and a silicon nitride layer 3 according to step a) of the protection method.

As example, the substrate 1 illustrated in FIG. 1 is typically prepared for manufacturing transistors. The substrate 1 actually comprises a trench 4 provided for insulating the transistors, silicon oxide $SiO_2$ under the substrate 1 in order to improve the performances of these devices in particular by limiting the leakage current, a gate 5 formed on a dielectric material 6, the flanks of the gate 5 being covered with a spacer 7 made of a nitrided material, a region for the source 8 and a region for the drain 9 raised with respect to the gate.

Figure 2:
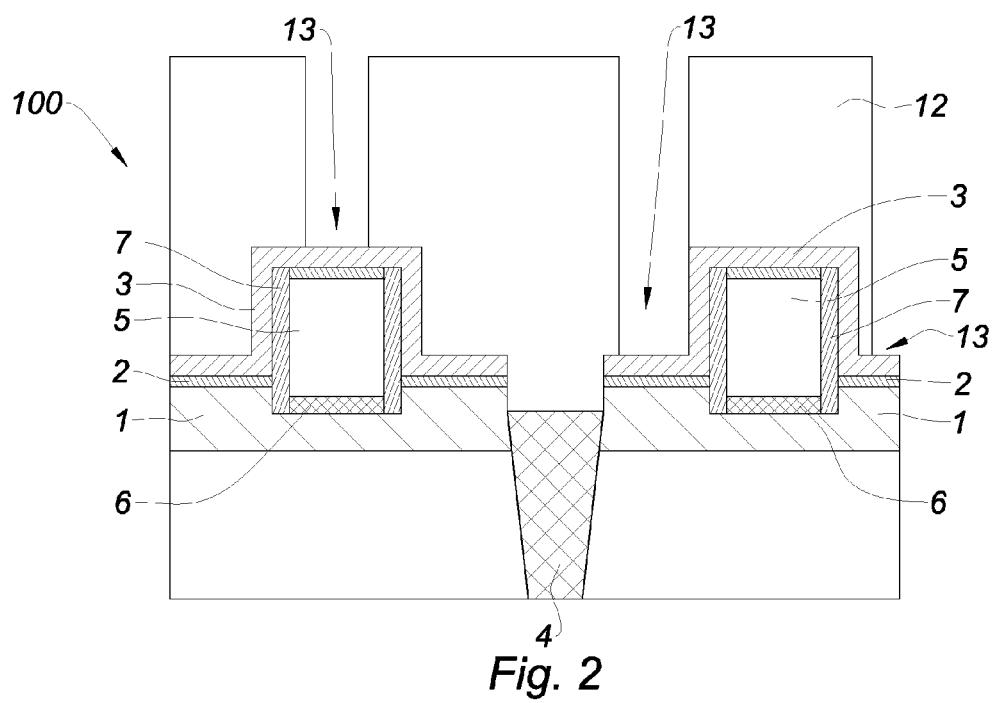
FIG. 2 illustrates a schematic sectional view of a stack at step b1) of the protection method according to an embodiment of the invention.
Figure 3:
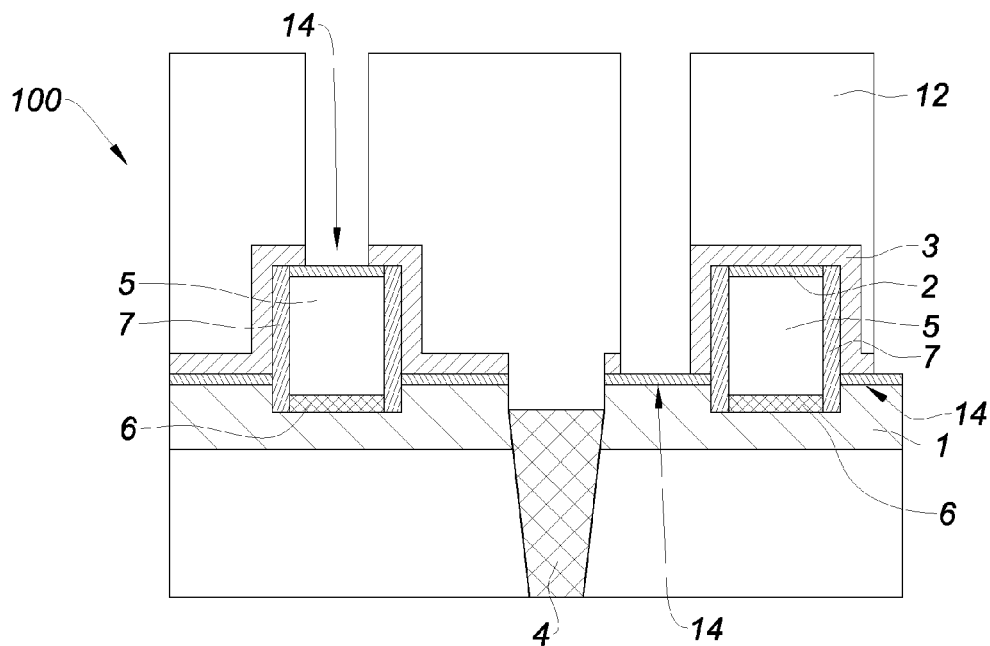
FIG. 3 illustrates a schematic sectional view of a stack at step b) of the protection method according to an embodiment of the invention.
Figure 4:
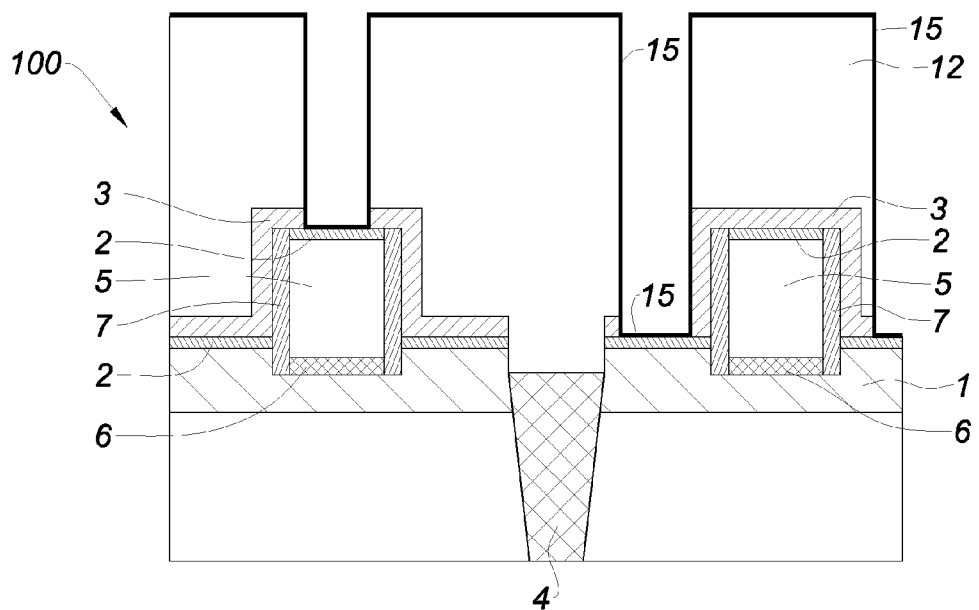
FIG. 4 illustrates a schematic sectional view of a stack at step c) of the protection method according to an embodiment of the invention.

According to step b1) of the protection method according to the invention, the stack 100 further comprises a mask 11 disposed over a silicon oxide $SiO_2$ layer 12 covering the silicon nitride layer 3. This mask 11 comprises openings allowing for the localized etching (for example with $CF_4$/$C_4F_8$) of the silicon oxide layer 12 (FIG. 2) and the determination of the regions 13 of the silicon nitride layer 3 to be etched. The SiN-based material of the layer 3 forms a barrier layer to the etching of the $SiO_2$ layer 12, so that the formed openings open onto the determined regions 13 of the silicon nitride layer 3 to be etched. Afterwards, the mask 11 is removed, for example using a plasma of $O_2$ (FIG. 2) prior to the etching of these determined regions 13. Etching is performed by fluorinated plasma, such as a $CH_3F/Ar/O_2$-based plasma selected to selectively stop at the silicide layer 2, so as to expose the silicide areas 14 intended to form electrical contacts (step b2) FIG. 3). Afterwards, a protective layer 15 according to step c) of the protection method is deposited over the exposed silicide areas 14 in the same chamber of the reactor having served for etching (FIG. 4). The used reactor may consist of an inductively-coupled reactor ICP or a capacitively-coupled reactor CCP. This deposition, carried out in situ, avoids the contact of the silicide areas 14 with air and the formation of residues, in particular in the presence of remainders of the etching reactant.

According to one possibility, the protective layer 15 is deposited by CxHy-based plasma, and in particular $CH_4$-based plasma, so as to form a carbon-containing protective layer 15, in particular under conditions allowing reaching a carbon content higher than 30% and preferably higher than 35%. To this end, the parameters below are applied, knowing that the carbon content can be checked by XPS surface analysis (XPS standing for X-ray Photoelectron Spectroscopy):

a CxHy-based plasma at a flow rate comprised between 10 $cm^3$/min and 100 $cm^3$/min further comprising nitrogen or oxygen at a flow rate comprised between 50-500 $cm^3$/min, over a duration comprised between 10 and 60 seconds, applied on the stack 100 maintained at a temperature comprised between 20° C.-100° C.

pressure: 10-200 mTorr

Power of the source: 100-1000 W

Polarization power (or Bias power—ions energy control): comprised between 0-200 W.

Beyond this polarization power, the elements derived from the carbon plasma might be implanted in the silicide layer 2 and damage it.

For a carbon-containing protective layer 15 of a 2 nanometers thickness, the deposition conditions consist, for example, in exposing the stack 100 for 10 seconds to a $CH_4$ and nitrogen plasma at a flow rate of 20 cm$^3$/min and 80 cm$^3$/min, respectively. The pressure is 50 mTorr, the temperature of the stack 100 is 60° C., the power of the source is 600 W and the polarization power is 100 W.

According to another possibility, the protective layer 15 is deposited by CxOy-based plasma, and in particular CO-based or CO2-based based plasma, which allow reaching a carbon content higher than 30%, and preferably higher than 35%, through a deposition mechanism identical to that obtained by CxHy-based plasma. For example, the CO-based plasma may be realized at a flow rate comprised between 50 cm$^3$/min and 500 cm$^3$/min further comprising nitrogen at a flow rate comprised between 0-150 cm$^3$/min, over a duration comprised between 10 and 60 seconds.

According to one variant, the protective layer 15 is made of a siliceous material. In this case, it is deposited by SixCly-based or SixFy-based plasma, in particular $SiCl_4$-based or $SiF_4$-based plasma respectively, at a flow rate comprised between 10 and 100 cm$^3$/min. A gas, such as nitrogen or oxygen, may be added to the siliceous gas, at a flow rate comprised between 50 and 500 cm$^3$/min, in order to increase the deposition speed. The power of the source is comprised between 100 and 500 W, the polarization power ranges from 0 to 200 W, the deposition duration is comprised between 5 and 60 seconds and the temperature of the stack 100 is maintained between 20 and 100° C.

In order to deposit a silicon-containing protective layer 15 of a 1-2 nm thickness, a $SiCl_4$ plasma is for example applied for 5 seconds at a flow rate of 95 cm$^3$/min, accompanied with nitrogen at a flow rate of 475 cm$^3$/min. The power of the used source is about 100 W, the polarization power is zero, and the pressure is about 10 mTorr.

Figure 5:
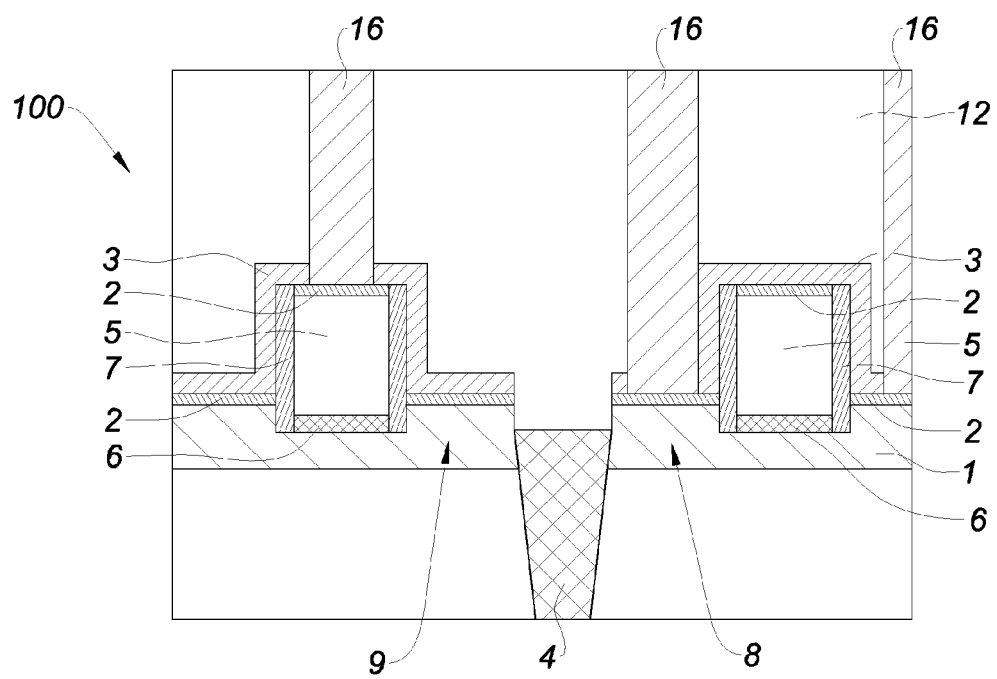
FIG. 5 illustrates a schematic sectional view of a stack at step e) of the protection method according to an embodiment of the invention.

As illustrated in FIG. 5, a metallization step is carried out afterwards in order to form the electrical contacts after cleaning of the stack 100 covered with the protective layer 15. According to one possibility, the cleaning according to step d) of the protection method is carried out by exposing the stack 100 to a SC1-type chemical medium comprising a $NH_4OH/H_2O_2$ solution. Such cleaning allows retrieving the remainders of reactants, possible contaminants and the protective layer 15 when the latter is made of siliceous material.

Finally, the metallization according to step e) of the protection method is carried out by depositing a metal layer 16, such as tungsten and a prior sputtering step over the exposed silicide areas 14. Indeed, this sputtering step allows eliminating the protective layer 15 when it is made of a carbonaceous material (with the exception of the flanks—not illustrated in FIG. 5) but also a possible oxidation of the silicide areas 14 prior to the tungsten deposition.

In the case of a copper metal layer 16, the deposition is carried out by ECD (ElectroChemical Deposition).

The silicide layer 2 may be constituted of numerous alloys of metals and silicon and may be, in particular, selected among PtSi, NiPtSi, NiSi, $NiSi_2$, $TiSi_2$ (C54 phase), $TiSi_2$ (C49 phase), $Co_2Si$, CoSi, $CoSi_2$, $WSi_2$, $MoSi_2$ and $TaSi_2$.

Thus, the present invention provides a decisive improvement to the state of the prior art by providing a protection method for protecting silicide areas 14 in order to form effective electrical contacts, rapidly and accurately. This results in that the devices formed from these contact areas are reliable and present an improved performance.

It goes without saying that the invention is not limited to the embodiments described above as examples but it encompasses all technical equivalents and variants of the described means as well as their combinations.

The invention claimed is:

1. A protection method for protecting a silicide layer intended to form electrical contacts for integrated circuits, the protection method comprising the steps of:
   a) Providing a stack comprising successively:
      a substrate,
      a silicide layer formed on the substrate, and
      a silicon nitride layer covering at least the silicide layer,
   b) Etching determined regions of the silicon nitride layer so as to expose at least areas of the silicide layer intended to form the electrical contacts, and
   c) Depositing a protective layer at least over the areas of the silicide layer exposed at step b),
      the protection method being devoid of any step of exposition of the stack to humidity between step b) and step c).

2. The protection method according to claim 1, wherein the etching of step b) is an etching by fluorinated plasma.

3. The protection method according to claim 1, wherein steps b) and c) are implemented in the same chamber of a reactor.

4. The protection method according to claim 1, wherein the protection method comprises, after step c), a step d) of subjecting the stack to a wet cleaning.

5. The protection method according to claim 4, wherein the protection method comprises, after step d), a step e) of depositing a layer of a metal over the areas of the silicide layer exposed at step b) so as to form the electrical contacts.

6. The protection method according to claim 1, wherein step c) is carried out by CxOy-based plasma, so as to form a carbon-containing protective layer.

7. The protection method according to claim 1, wherein step c) is carried out by CxHy-based plasma, so as to form a carbon-containing protective layer.

8. The protection method according to claim 6, wherein step c) is carried out so that the protective layer comprises a carbon content higher than 30%.

9. The protection method according to claim 1, wherein step c) is carried out using plasma of a gas comprising silicon, so as to deposit a silicon-containing protective layer.

10. The protection method according to claim 7, wherein step c) is implemented using a plasma further formed from one or several gas(es) selected among nitrogen and oxygen, provided at a flow rate comprised between 50 and 500 cm$^3$/min.

11. The protection method according to claim 1, wherein the nature of the silicide layer is selected among the following natures of silicides: PtSi, NiPtSi, NiSi, $NiSi_2$, $TiSi_2$ (C54 phase), $TiSi_2$ (C49 phase), $Co_2Si$, CoSi, $CoSi_2$, $WSi_2$, $MoSi_2$, $TaSi_2$.

12. The protection method according to claim 1, wherein step b) comprises a step b1) of determining the regions of the silicon nitride layer to be etched by a protection of portions of the silicon nitride layer to be preserved from etching with a silicon oxide layer, and a step b2) of etching the determined regions.

13. The protection method according to claim 12, wherein the protecting of portions of the silicon nitride layer to be preserved from etching in step b1), is carried out by application of an etching mask over the silicon oxide layer, the mask comprising through openings in line with the determined regions of the silicon nitride layer to be etched.

14. The protection method according to claim 1, wherein step c) is performed by a plasma treatment.

15. The protection method according to claim 7, wherein step c) is carried out so that the protective layer comprises a carbon content higher than 30%.

16. The protection method according to claim 1, wherein step c) is carried out using plasma of a gas based on SixCly or SixFy so as to deposit a silicon-containing protective layer.

* * * * *